TRAVELING WAVE TRANSISTOR

Filed Aug. 25, 1965

George W. McIver,
INVENTOR.
BY.
AGENT.

United States Patent Office 3,378,738
Patented Apr. 16, 1968

3,378,738

TRAVELING WAVE TRANSISTOR

George W. McIver, Playa Del Rey, Calif., assignor to TRW Inc., Redondo Beach, Calif., a corporation of Ohio Filed Aug. 25, 1965, Ser. No. 482,348
11 Claims. (Cl. 317—235)

ABSTRACT OF THE DISCLOSURE

A field effect transistor is described in which the gate and the connector for connecting the drain define a four terminal device. The lateral distances between the input terminal on the gate and the output terminal on the gate define an input transmission line having a characteristic impedance. The space between the input and output terminals on the drain output line also define an output transmission line having a given characteristic impedance. By careful selection of parameters it is possible to construct a field effect transistor having a definite characteristic impedance predictable in advance.

This invention relates generally to field effect transistors and more particularly to a novel field effect transistor that provides a gain over an extreme broad band of frequencies.

In this invention, there is described a traveling wave transistor having high frequency and medium power applications. The completed device may be likened to a broad band amplifier using distributed active elements such as the insulated gate field effect transistor. In operation, the input and output terminals may be strip-type transmission lines with an infinite number of active field effect transistors cross linking the two lines. In the preferred embodiment, the device comprises a heavily doped (N+) source strip diffused into a lightly doped (P) substrate and ohmically connected to a conductive ground plane contacting the substrate. Spaced apart from the source is a heavily doped (N+) output drain diffused into the substrate but spaced apart and substantially parallel to the source. The defined space between the source and the drain is medium to lightly doped (N) and usually called a channel or path for current flow.

The output lead is ohmically connected along the length of the drain. An oxide coating such as silicon oxide ($SiO_2$) covers the source channel and exposed portions of the drain not already connected to the input and output leads.

The external voltages are chosen with respect to the kinds of doping used so as to generate a field between the gate and the source and the channel. The invention resides in the application of the input (gate) strip line, the output (drain) strip line, and the active portion of the field effect transistor between the input line and the output line distributed along the length of the source.

Further objects and advantages of the invention will be made more apparent by referring now to the accompanying drawings wherein.

Figure 1:
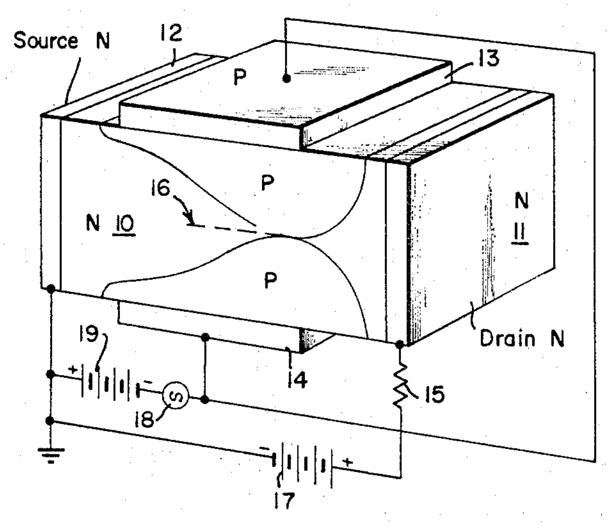
FIGURE 1 illustrates a conventional field effect transistor.

Referring now to FIGURE 1, there is shown a conventional field effect transistor comprising a lightly doped N type body 10 on substrate having a heavily doped N type drain 11 at one end and a heavily doped N type source 12 at the other end of the body 10. Located intermediate the source 12 and the drain 11 is a lightly doped P type gate 13 located substantially parallel to the source and the drain. In this embodiment, a ground plate 14 having the same properties as the gate 13 and is located on the other side of the body 10 opposite the gate to thereby define a depletion boundary 16 in the body between the gate 13 and the ground plane. A load resistor 15 is connected between a source of potential 17 and the drain 11. An input signal 18 properly biased by battery 19 is connected to the parallel combination of the ground plane 14 and the gate 13 for modulating the defined depletion boundary. The field effect transistor is actually an amplifying device that uses the depletion regions of a back-biased PN junction to reduce the conductive cross-section for ohmic (drift) conduction parallel to the junctions.

While FIGURE 1 shows one possible construction, using junctions on a bar of N material, it is well known that the opposite polarity can also be used. The body 10 is an extrinsic N type conductor carrying a current directed from the ohmic drain contact 11 to the ohmic source contact 12. The gate is shown consisting of a pair of opposing P regions, sandwiching part of the conducting path. The back biased junctions formed are operated so that the depletion regions extend into the conducting path. The strong field in the depletion regions repels electrons thereby keeping the conduction path restricted to the thin section between the depletion region boundaries. The vertical potential drop in the bar 10 causes that portion of the gate 13 closets to the drain 11 to have more back bias than the portion near the source 12. The depletion regions will thereby extend further into the bar near the drain than near the source. If the drain supply voltage is increased, the drain current will increase; however, the potential drop from the source to the bottom of the gate will also increase, bringing the depletion boundaries closer together which increases the resistance of the source-to-drain path. At high enough drain voltage, the depletion boundaries move close together until further increase of drain voltage produces no current increase. This value of drain voltage is called the pinch-off voltage. The field effect transistor used in the present invention is preferably of the type known as the insulated gate field effect transistor.

Figure 2:
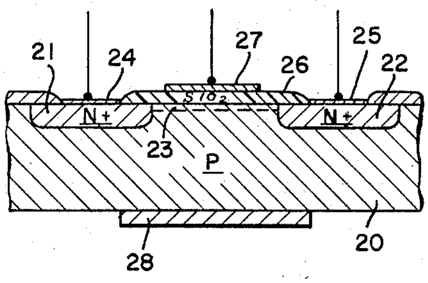
FIGURE 2 is a cross-section view of an insulated gate field effect transistor.

FIGURE 2 illustrates an insulated gate field effect transistor. The P-type body 20 contains a diffused source 21 (N+) and a diffused drain 22 (N+) separated by a N-type chanel 23. Electrical contact with the source 21 is through a conductive strip 24 held in ohmic contact with the source. In a similar manner the contact with the drain 22 is through a conductive strip 25 held in ohmic contact with the drain. A silicon oxide ($SiO_2$) coating 26 substantially covers portions of the source 21 and the drain 22 and all of the channel 23. The gate comprises a conductive strip 27 bonded to the insulation coating 26. Located on the side of the body 20 opposite the gate strip 27 is a ground plane 28 electrically connected to the gate strip in order to help generate the depletion region between the source 21 and the channel 23.

Figure 3:
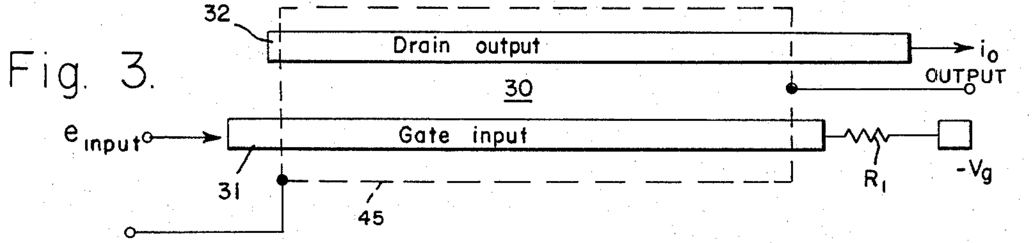
FIGURE 3 illustrates a top view of a traveling wave field effect transistor.

Referring now to FIGURE 3, there is shown a traveling wave field effect transistor comprising a body 30 having an electrically conductive gate 31 and a spaced-apart electrically conductive drain 32 placed along the length of the body. The field effect transistor action occurs between the drain 32 and the gate 31. It is well-known that the input and output susceptances limit the high frequency response in present-day devices. These susceptances can be truly tuned out only at single frequencies and approximately tuned out over narrow bandwidths. The device illustrated in FIGURES 3 and 4 eliminates the problem by making the input and output of the device transmission lines rather than lumped susceptances. By controlling the characteristic impedances of these lines equal to the characteristic impedance of the input and output lines exterior to the device, a completely broad band match is obtained. This technique eliminates the usual limitation on gate length of field effect devices, so any $G_m$ can be obtained with no sacrifice in frequency response. The device is then similar to a field effect or bipolar transistor in cross-section, with the theory of operation similar to a hybrid of traveling wave tubes and transistors.

Figure 4:
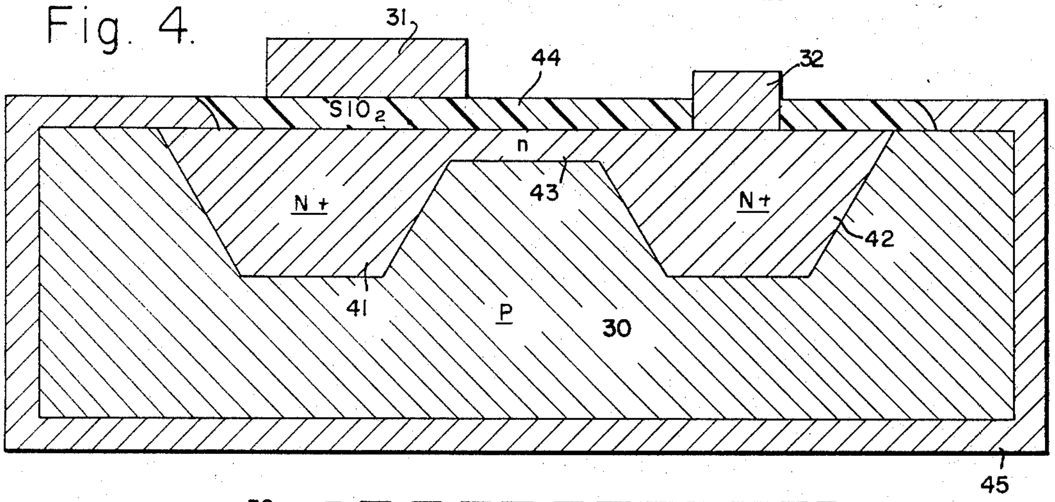
FIGURE 4 is a cross-section of FIGURE 3.

Referring now to FIGURE 4, there is shown a cross section of FIGURE 3. In the preferred embodiment, a lightly doped P-type body 30 is used having a diffused, heavily doped N++-type source 41 and N++-type drain 42 separated by a lightly doped N-type channel 43. The output line 32 is in ohmic contact with the drain 42. A layer of silicon oxide 44 ($SiO_2$) covers the source 41, the channel 43, and portions of the drain 42 not contacting the line 32. Located on top of the silicon oxide 44 is the gate input line 31. The body 30 is preferably encased in a conductive ground plane 45 ohmically connected to the source 41.

For optimum performance, it is necessary that the characteristic impedance of the output line match the input impedance of the next stage of the system; the characteristic impedance of the input line match the output impedance of the driving circuit; the phase velocities are required to be equal on the input and output lines; and the $G_m$ per unit length shall be reasonably high and have high frequency cutoff.

For example, if 50Ω is chosen as the characteristic impedance, the cross-section of the input line 31 (gate) must give a 50Ω characteristic impedance. The cross-section of the output line 32 (drain) must also give 50Ω characteristic impedance. Furthermore, the phase velocity on the input line must equal the phase velocity on the output line.

The active part of the device requires that the channel 43 conductivity be as high as possible consistent with using reasonable bias currents and voltages, and that the electrical "length" of the gate overlapping the channel be small. Controlling the spacing of the output line 32 and drain 42 from the ground plane 45 and the width of the output line and drain gives the proper capacitance per unit length and proper inductance per unit length on the output line.

Controlling the oxide 44 thickness and a gate 31 width gives the proper capacitance per unit length and inductance per unit length on the input line.

Controlling the channel diffusion and gate overlap gives sufficient $G_m$ per unit length, and making the body 30 long enough achieves usuable gain with the cross section as developed.

The current and voltage equations for the output line may be expressed as follows. Mutual capacitance and inductance between input and output lines are neglected for simplicity.

$$-i_o(x)=i_o(0)+\int_0^x Y_0 e_0(x')dx'+\int_0^x G_m e_{in}(x')dx'$$

$$e_o(x)=e_o(0)-\int_0^x Z_o i_o(x')dx$$

where $i_0(x)$=current on output line at point $x$
$e_0(x)$=voltage on output line at point $x$
$Y_o=jC_0\omega$
$Z_o=jL_o\omega$
$G_m$=transconductance per unit length
$C_0$=capacitance per unit length, output line
$L_0$=inductance per unit length, output line by differentiation $$\frac{-di_o}{dx}=Y_o e_o(x)+G_m e_{in}(x)$$

$$\frac{d^2i_o}{dx^2}=-Y_o\frac{de_o(x)}{dx}-G_m\frac{de_{in}(x)}{dx}$$

$$\frac{de_o}{dx}=-Z_o i_o(x)$$

Then $$\frac{d^2i_o}{dx^2}=Z_oY_oi_o(x)-G_m\frac{de_{in}(x)}{dx} \qquad (1)$$

$$e_{in}(x)=e_{in}(0)e^{-j\omega\sqrt{L_1C_1x}}$$

(wave traveling to right)

where $L_1$=inductance per unit length, input line
$C_1$=capacitance per unit length, input line The solution to the homogenous part of Equation 1 is:

$$i_o=Ae^{\sqrt{Z_oY_ox}}+Be^{-\sqrt{Z_oY_ox}}$$

$$\sqrt{Z_oY_o}=j\omega\sqrt{L_oC_o}$$

For a particular solution to inhomogeneous equation, use $$i_o=ke^{-j\omega\sqrt{L_1C_1x}}$$

$$-\omega^2L_1C_1ke^{-j\omega\sqrt{L_1C_1x}}=$$
$$-\omega^2L_oC_oke^{-j\omega\sqrt{L_1C_1x}}-jG_me_{in}{}^{(0)\omega\sqrt{L_1C_1\theta}}{}^{-j\omega\sqrt{L_1C_1}}$$

Thus $$k=\frac{j\omega\sqrt{L_1C_1}G_me_{in}(0)}{\omega^2(L_1C_1-L_oC_o}$$

and $$i_o(l)=Ae^{j\omega\sqrt{L_oC_ol}}+Be^{-j\omega\sqrt{L_oC_ol}}+ke^{-j\omega\sqrt{L_oC_ol}}$$

where $l$=length of active device

If the output line is terminated properly, there is no reflected wave, $A=0$. If the output line as open at $$x=0,\ i_{(o)}=0, \text{ hence } B=-k$$

so $$i_o(l)=k\left\{e^{-j\omega\sqrt{L_1C_1l}}-e^{-j\omega\sqrt{L_oC_ol}}\right\}$$

as $L_1C_1 \rightarrow L_oC_o$ this becomes $$i_o(l)=\left\{-G_m\frac{l}{2}e^{-j\omega\sqrt{L_1C_1l}}\right\}e_{in}(0) \qquad (2)$$

Other boundary conditions would give somewhat different results, except the case where the left end is terminated in $R_0$. This last case also has Eq. 2 as a transfer function. Equation 2 relates output current to input voltage. Power gain is then $$\frac{P_o}{P_i}=\frac{G^2{}_{m1}{}^2R_o{}^2}{4} \qquad (3)$$

or $$G_p(db)=20\log_{10}\frac{(G_{m1}R_o)}{2} \qquad (4)$$

where $R_o=\sqrt{L_o/C_o}$=characteristic impedance of output line.

The only frequency dependant term in the gain equation above is $G_m$. The frequency response of $G_m$ is determined by the overlap of the gate over the channel, gate to channel capacitance, and channel conductivity. Using practical values, the operation of the device should extend into the gigacycle region with moderate gain.

This completes the description of the embodiment of the invention illustrated herein. However, many modifications and advantages thereof will be apparent to persons skilled in the art without departing from the spirit and scope of this invention. Accordingly, it is desired that this invention not be limited to the particular details of the embodiment disclosed herein, except as defined by the appended claims.

What is claimed is:

1. A field effect transistor comprising
a substrate of lightly doped material having a first major surface,
a conductive surface termed a ground plane encompassing said material except for a portion of said major surface,
a heavily doped source region located in a first portion of said substrate and contacting said ground plane,
a heavily doped drain region located in a second portion of said substrate and spaced from said source thereby defining a channel, said regions and channel terminating on said first surface,
a conductive strip contacting said heavily doped drain region, said conductive strip and said drain region together with said ground plane comprising an output transmission line having a given characteristic impedance and phase velocity,
the said channel providing a current path between said source and said drain region,
a layer of insulating material located on said first surface over said region and channel,
a conductive gate strip located on said layer for controlling said current path,
said gate strip together with said ground plane comprising an input transmission line having a given characteristic impedance and phase velocity.

2. A field effect transistor according to claim 1 in which the phase velocity of said output transmission line and said input transmission line is equal.

3. A field effect transistor according to claim 1 in which the characteristic impedance of said output transmission line and said input transmission line is equal.

4. A field effect transistor according to claim 1 in which said conductive strip contacting said drain is a metal strip.

5. A field effect transistor comprising
a substrate of lightly doped material having a first major surface,
a conductive surface termed a ground plane encompassing said material except for a portion of said major surface,
a heavily doped source region located in a first portion of said substrate and contacting said ground plane,
a heavily doped drain region located in a second portion of said substrate and spaced from said source thereby defining a channel, said regions and channel terminating on said first surface,
a conductive strip contacting said heavily doped drain region, said conductive strip and said drain region together with said ground plane comprising an output transmission line having a given characteristic impedance and phase velocity,
the said channel being lightly doped and providing a current path between said source and said drain region,
a layer of insulating material located on said first surface over said region and channel,
a conductive gate strip located on said layer for controlling said current path,
said gate strip together with said ground plane comprising an input transmission line having a given characteristic impedance and phase velocity.

6. A field effect transistor comprising
a substrate of lightly doped material having a first polarity and a first major surface,
a conductive surface termed a ground plane encompassing said material except for a portion of said major surface,
a heavily doped source region having a second polarity located in a first portion of said substrate and contacting said ground plane, a heavily doped drain region having a second polarity located in a second portion of said substrate and spaced from said source thereby defining a channel, said regions and channel terminating on said first surface,
a conductive strip contacting said heavily doped drain region, the cross-section of said conductive strip and said drain region together with the cross-section of said ground plane comprising an output transmission line having a given characteristic impedance and phase velocity,
the said channel being lightly doped and having a second polarity for providing a current path between said source and said drain region,
a layer of insulating material located on said first surface over said region and channel,
a conductive gate strip located on said layer for controlling said current path,
said gate strip together with said ground plane having a cross-section comprising an input transmission line having a given characteristic impedance and phase velocity.

7. A field effect transistor according to claim 6 in which the phase velocity of said input transmission line and said output transmission line is equal.

8. A field effect transistor comprising
a substrate of lightly doped material having a first major surface,
a conductive surface termed a ground plane encompassing said material except for a portion of said major surface,
a heavily doped source region located in a first portion of said substrate and contacting said ground plane,
a heavily doped drain region located in a second portion of said substrate and spaced from said source thereby defining a channel, said regions and channel terminating on said first surface,
a conductive strip contacting said heavily doped drain region, said conductive strip and said drain region together with said ground plane comprising an output transmission line having a given characteristic impedance and phase velocity,
the said channel providing a current path between said source and said drain region,
a layer of insulating material located on said first surface over said region and channel,
a conductive gate strip located on said layer for generating a back biased region between said source and said channel to thereby control said current path, said gate strip together with said ground plane comprising an input transmission line having a given characteristic impedance and phase velocity.

9. A field effect transistor comprising
a substrate of lightly doped material having a first major surface,
a conductive surface termed a ground plane encompassing said material except for a portion of said major surface,
a heavily doped source region located in a first portion of said substrate and contacting said ground plane,
a heavily doped drain region located in a second portion of said substrate and spaced from said source thereby defining a channel, said region and channel terminating on said first surface,
a conductive strip contacting said heavily doped drain region, said conductive strip and said drain region together with said ground plane comprising an output transmission line having a given characteristic impedance and phase velocity,
the said channel providing a current path between said source and said drain region,
a layer of insulating material located on said first surface over said region and channel,
a conductive gate strip located on said layer for controlling said current path, said electrically conductive ground plane held in contact with said substrate and electrically connected to said gate strip, said gate strip together with said source, said body and said ground plane comprising an input transmission line having a given characteristic impedance and phase velocity.

10. A field effect transistor comprising a substrate of lightly doped material having a first major surface, a conductive surface termed a ground plane encompassing said material except for a potrion of said major surface, a heavily doped source region located in a first portion of said substrate and contacting said ground plane, a heavily doped drain region located in a second portion of said substrate and spaced from said source thereby defining a channel, said region and channel terminating on said first surface, a conductive strip contacting said heavily doped drain region, said conductive strip and said drain region together with said ground plane comprising an output transmission line having a given characteristic impedance and phase velocity, the said channel providing a current path between said source and said drain region, a dielectric coating on said first surface covering said source and said channel, a conductive gate strip located on said layer for controlling said current path through said channel, said gate strip together with said ground plane comprising an input transmission line having a given characteristic impedance and phase velocity.

11. A field effect transistor according to claim 10 in which said dielectric is composed of silicon oxide ($SiO_2$).

References Cited

UNITED STATES PATENTS

| | | | |
|---|---|---|---|
| 3,233,122 | 2/1966 | Theriault | 330—38 |
| 3,328,601 | 6/1967 | Rosenbaum | 317—235 |

OTHER REFERENCES

Electronics, "Researchers Turn to Germanium for a MOS Field-Effect Transistor," by Harrap et al., Nov. 30, 1964 (pp. 64–68), 307088.5/21.4.

JOHN W. HUCKERT, *Primary Examiner.*

J. D. CRAIG, *Assistant Examiner.*